United States Patent
Nomaru et al.

(10) Patent No.: US 11,361,996 B2
(45) Date of Patent: Jun. 14, 2022

(54) HEIGHT DETECTING APPARATUS AND LASER PROCESSING APPARATUS

(71) Applicant: DISCO CORPORATION, Tokyo (JP)

(72) Inventors: Keiji Nomaru, Tokyo (JP); Taiki Sawabe, Tokyo (JP); Nobuyuki Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 959 days.

(21) Appl. No.: 16/117,855

(22) Filed: Aug. 30, 2018

(65) Prior Publication Data

US 2019/0074221 A1 Mar. 7, 2019

(30) Foreign Application Priority Data

Sep. 6, 2017 (JP) .............................. JP2017-171143

(51) Int. Cl.
| | |
|---|---|
| B23K 26/03 | (2006.01) |
| H01L 21/78 | (2006.01) |
| B23K 26/352 | (2014.01) |
| B23K 26/53 | (2014.01) |
| B23K 26/08 | (2014.01) |
| B23K 26/04 | (2014.01) |
| B23K 26/00 | (2014.01) |
| B23K 26/06 | (2014.01) |
| H01S 3/10 | (2006.01) |
| H01S 5/02 | (2006.01) |
| B23K 101/40 | (2006.01) |

(52) U.S. Cl.
CPC .......... *H01L 21/78* (2013.01); *B23K 26/0006* (2013.01); *B23K 26/032* (2013.01); *B23K 26/048* (2013.01); *B23K 26/06* (2013.01); *B23K 26/0853* (2013.01); *B23K 26/0869* (2013.01); *B23K 26/352* (2015.10); *B23K 26/53* (2015.10); *H01S 3/10* (2013.01); *H01S 5/0201* (2013.01); *B23K 2101/40* (2018.08)

(58) Field of Classification Search
CPC .... B23K 26/032; B23K 26/048; B23K 26/06; B23K 26/0006; G01B 11/0608; H01L 21/67259; H01L 21/78; H01S 3/10; H01S 5/0201
See application file for complete search history.

(56) References Cited

FOREIGN PATENT DOCUMENTS

| JP | 10305420 A | 11/1998 |
|---|---|---|
| JP | 2002192370 A | 7/2002 |
| JP | 2011122894 A | 6/2011 |
| JP | 2011196785 | * 10/2011 |
| JP | 2014221483 A | 11/2014 |

* cited by examiner

*Primary Examiner* — Michael Carter
(74) *Attorney, Agent, or Firm* — Greer Burns & Crain Ltd.

(57) ABSTRACT

A spectral interference height detecting apparatus includes a chuck table for holding a workpiece thereon and a height detecting unit for detecting the height of an upper surface of the workpiece held on the chuck table. The height detecting unit includes a light source for emitting light in a predetermined wavelength band into a first optical path, a condenser disposed in the first optical path for converging light onto the workpiece held on the chuck table, a beam splitter disposed between the light source and the condenser for splitting the light in the first optical path into a second optical path, a mirror disposed in the second optical path to form a basic optical path length, for reflecting light into the second optical path and returning light through the beam splitter to the first optical path.

4 Claims, 7 Drawing Sheets

FIG.7

| HEIGHT (Z) | X COORDINATES | Y COORDINATES |
|---|---|---|
| $Z_{(1,1)}$ | $X_1$ | $Y_1$ |
| $Z_{(2,1)}$ | $X_2$ | $Y_1$ |
| $Z_{(3,1)}$ | $X_3$ | $Y_1$ |
| $Z_{(4,1)}$ | $X_4$ | $Y_1$ |
| $Z_{(5,1)}$ | $X_5$ | $Y_1$ |
| $Z_{(6,1)}$ | $X_6$ | $Y_1$ |
| $Z_{(7,1)}$ | $X_7$ | $Y_1$ |
| $Z_{(8,1)}$ | $X_8$ | $Y_1$ |
| ⋮ | ⋮ | ⋮ |
| $Z_{(n-7,n)}$ | $X_{n-7}$ | $Y_n$ |
| $Z_{(n-6,n)}$ | $X_{n-6}$ | $Y_n$ |
| $Z_{(n-5,n)}$ | $X_{n-5}$ | $Y_n$ |
| $Z_{(n-4,n)}$ | $X_{n-4}$ | $Y_n$ |
| $Z_{(n-3,n)}$ | $X_{n-3}$ | $Y_n$ |
| $Z_{(n-2,n)}$ | $X_{n-2}$ | $Y_n$ |
| $Z_{(n-1,n)}$ | $X_{n-1}$ | $Y_n$ |
| $Z_{(n,n)}$ | $X_n$ | $Y_n$ |

HEIGHT DETECTING APPARATUS AND LASER PROCESSING APPARATUS

BACKGROUND OF THE INVENTION

Field of the Invention

The present invention relates to a height detecting apparatus for detecting the height of a workpiece such as a semiconductor wafer or the like held on a chuck table and a laser processing apparatus incorporating such a height detecting apparatus.

Description of the Related Art

Wafers having a plurality of devices such as integrated circuits (ICs), large scale integrated circuits (LSIs) circuits, etc. formed in areas demarcated on a face thereof by a grid of projected dicing lines are divided by a dicing apparatus, a laser processing apparatus, or the like into individual device chips that are used in electric equipment such as mobile phones, personal computers, etc.

There are different types of laser processing apparatus available for processing workpieces. According to one type of laser processing apparatus, a laser beam having a wavelength that is absorbable by a workpiece is applied to the workpiece while the focused spot of the laser beam is positioned on an upper surface of the workpiece, thereby to perform an ablation process on the workpiece (see, for example, Japanese Patent Laid-open No. 1998-305420). Another type of laser processing apparatus applies a laser beam having a wavelength that is transmittable through a workpiece to the workpiece while positioning the focused spot of the laser beam within the workpiece to form modified layers in the workpiece (see, for example, Japanese Patent No. 3408805). According to still another type of laser processing apparatus, a laser beam having a wavelength that is transmittable through a workpiece is applied to the workpiece while positioning the focused spot or region of the laser beam within the workpiece to form a plurality of shield tunnels in the workpiece, each made up of a pore extending from an upper surface of the workpiece to the reverse side thereof and an amorphous body surrounding the pore (see, for example, Japanese Patent Laid-open No. 2014-221483).

If the upper surface of the workpiece has undulations, then the focused spot of the laser beam cannot be placed at appropriate positions on the workpiece. Therefore, there has been proposed by the present applicant a technology for detecting the height of a to-be-processed region of a workpiece to which a laser beam is to be applied thereby to generate height information and applying the laser beam to the workpiece to process the workpiece while positioning the focused spot of the laser beam at an appropriate position based on the height information (see, for example, Japanese Patent Laid-open No. 2011-122894).

SUMMARY OF THE INVENTION

According to the invention disclosed in Japanese Patent Laid-open No. 2011-122894, despite undulations on the surface of the workpiece, the height of the to-be-processed area is detected and stored as height information, and the position of the focused spot of the laser beam is corrected based on the stored height information before the laser beam is applied to the workpiece. Therefore, when the workpiece is processed by the laser beam, the focused spot of the laser beam is placed at a desired appropriate position on the workpiece while the laser beam is being applied to the workpiece.

There is known in the art a spectral-interference height detecting apparatus that detects the height of the upper surface of a workpiece by applying light in a particular wavelength band to the upper surface of the workpiece, capturing an interference between reflected light and reference light with an image sensor, and performing Fourier transform, etc. on the captured interference. If a film such as an oxide film, an insulating film, or the like is deposited on the upper surface of the workpiece, however, the light in the particular wavelength band is not sufficiently reflected from the upper surface of the workpiece, with the result that the height of the upper surface of the workpiece cannot properly be detected.

It is therefore an object of the present invention to provide a height detecting apparatus which is capable of properly detecting the height of the upper surface of a workpiece even if a film such as an oxide film, an insulating film, or the like is deposited on the upper surface of the workpiece, and a laser processing apparatus which incorporates such a height detecting apparatus.

In accordance with an aspect of the present invention, there is provided a spectral interference height detecting apparatus including a chuck table for holding a workpiece thereon, and a height detecting unit configured to detect the height of an upper surface of the workpiece held on the chuck table, in which the height detecting unit includes a light source for emitting light in a predetermined wavelength band into a first optical path, a condenser disposed in the first optical path for converging light onto the workpiece held on the chuck table, a beam splitter disposed between the light source and the condenser for splitting the light in the first optical path into a second optical path, a mirror disposed in the second optical path to form a basic optical path length, for reflecting light into the second optical path and returning light through the beam splitter to the first optical path, an optical splitter disposed between the beam splitter and the light source, for splitting interference light produced from light reflected by the upper surface of the workpiece held on the chuck table and returned through the condenser to the first optical path and light returned by the mirror, from the first optical path into a third optical path, and a calculating unit disposed in the third optical path, for calculating the height of the workpiece based on the interference light, in which the calculating unit includes a wavelength band splitter for splitting the light in the wavelength band emitted from the light source into light in at least two wavelength bands, and a selector for selecting light in either one of the two wavelength bands from the wavelength band splitter, and in which interference light in the wavelength band selected by the selector is captured by an image sensor for calculating the height of the workpiece.

Preferably, the wavelength band splitter includes a dichroic mirror for transmitting therethrough light in a first wavelength band included in the light in the predetermined wavelength band emitted from the light source and reflecting light in a second wavelength band included in the light in the predetermined wavelength band emitted from the light source, a first bandpass filter disposed in an optical path for the light in the first wavelength band, for removing noise from the light in the first wavelength band, a first diffraction grating for dispersing light from the first bandpass filter in the first wavelength band, a second bandpass filter disposed in an optical path for the light in the second wavelength band, for removing noise from the light in the second wavelength band, and a second diffraction grating for dispersing light from the second bandpass filter in the second wavelength band, and in which the selector includes a light blocking plate for blocking either one of the optical path for the light in the first wavelength band and the optical path for the light in the second wavelength band.

Preferably, the calculating unit includes a memory for storing information of the calculated height of the workpiece based on coordinates of the workpiece.

In accordance with another aspect of the present invention, there is provided a laser processing apparatus including a chuck table for holding a workpiece thereon, a height detecting unit configured to detect the height of an upper surface of the workpiece held on the chuck table, a laser oscillator for oscillating a laser and emitting a laser beam, and an optical system for guiding the laser beam emitted from the laser oscillator to a condenser, in which the height detecting unit includes a light source for emitting light in a predetermined wavelength band into a first optical path, a condenser disposed in the first optical path for converging light onto the workpiece held on the chuck table, a beam splitter disposed between the light source and the condenser for splitting the light in the first optical path into a second optical path, a mirror disposed in the second optical path to form a basic optical path length, for reflecting light into the second optical path and returning light through the beam splitter to the first optical path, an optical splitter disposed between the beam splitter and the light source, for splitting interference light produced from light reflected by the upper surface of the workpiece held on the chuck table and returned through the condenser to the first optical path and light returned by the mirror, from the first optical path into a third optical path, and a calculating unit disposed in the third optical path and configured to calculate the height of the workpiece based on the interference light; the calculating unit includes a wavelength band splitter for splitting the light in the wavelength band emitted from the light source into light in at least two wavelength bands, a selector for selecting light in either one of the two wavelength bands from the wavelength band splitter, and a memory for storing information of the calculated height of the workpiece based on coordinates of the workpiece; and interference light in the wavelength band selected by the selector is captured by an image sensor for detecting the height of the workpiece; the laser processing apparatus further including an actuator disposed on the condenser, for moving the condenser toward and away from the workpiece held on the chuck table based on the information of the calculated height stored in the memory.

Preferably, the wavelength band splitter of the laser processing apparatus includes a dichroic mirror for transmitting therethrough light in a first wavelength band included in the light in the wavelength band emitted from the light source and reflecting light in a second wavelength band included in the light in the wavelength band emitted from the light source, a first bandpass filter disposed in an optical path for the light in the first wavelength band, for removing noise from the light in the first wavelength band, a first diffraction grating for dispersing light from the first bandpass filter in the first wavelength band, a second bandpass filter disposed in an optical path for the light in the second wavelength band, for removing noise from the light in the second wavelength band, and a second diffraction grating for dispersing light from the second bandpass filter in the second wavelength band, and in which the selector includes a light blocking plate for blocking either one of the optical path for the light in the first wavelength band and the optical path for the light in the second wavelength band.

The height detecting apparatus according to the present invention is able to properly detect the height of the upper surface of the workpiece by selecting the light in either one of the two wavelength bands even if the upper surface of the workpiece is deposited with a film such as an oxide film, an insulating film, or the like.

The laser processing apparatus that incorporates the height detecting apparatus is able to process the workpiece as desired by applying the laser beam to the workpiece while placing a focused spot of the laser beam at an appropriate position based on the information of the detected height.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 7 is a table of height information stored in a storage unit of a control unit included in the laser processing apparatus depicted in FIG. 1.

DETAILED DESCRIPTION OF THE PREFERRED EMBODIMENT

Figure 1:
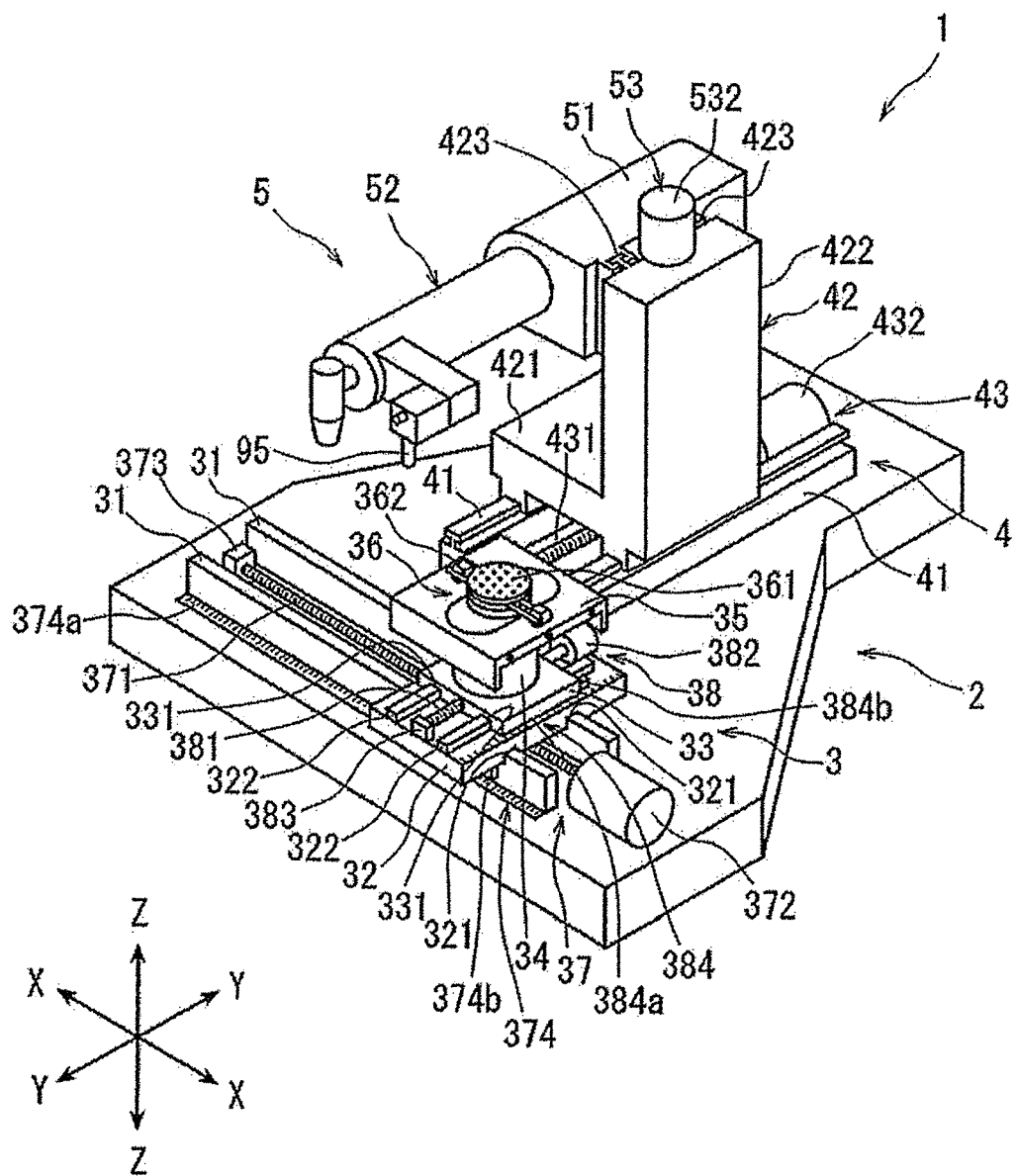
FIG. 1 is a perspective view of a laser processing apparatus according to an embodiment of the present invention.

A height detecting apparatus for detecting the height of the upper surface of a workpiece and a laser processing apparatus which incorporates the height detecting apparatus according to an embodiment of the present invention will be described in detail below with reference to the accompanying drawings. FIG. 1 depicts in perspective a laser processing apparatus that incorporates a height detecting apparatus according to an embodiment of the present invention. The laser processing apparatus, denoted by 1 in FIG. 1, includes a stationary base 2, a holding mechanism 3 for holding a workpiece to be processed, the holding mechanism 3 being disposed on the stationary base 2 for movement in processing feed directions, i.e., X-axis directions, indicated by the arrows X, a laser beam applying unit support mechanism 4 disposed on the stationary base 2 for movement in indexing feed directions, i.e., Y-axis directions, indicated by the arrows Y perpendicular to the X-axis directions, and a height detecting and laser beam applying unit 5 disposed on the laser beam applying unit support mechanism 4 for movement in focused-spot position adjusting directions, i.e., Z-axis directions, indicated by the Z arrows perpendicular to the X-axis directions and Y-axis directions.

The holding mechanism 3 includes a pair of guide rails 31 disposed on the stationary base 2 and extending parallel to each other along the X-axis directions, a first slide block 32 slidably disposed on the guide rails 31 for movement in the X-axis directions, a second slide block 33 slidably disposed on the first slide block 32 for movement in the Y-axis directions, a support table 35 supported on the second slide block 33 by a hollow cylindrical member 34, and a chuck table 36 supported on the support table 35, for holding the workpiece. The chuck table 36 includes a suction chuck 361 made of a porous material, and holds the workpiece, such as a circular semiconductor wafer, for example, on an upper holding surface of the suction chuck 361 under suction forces applied from suction means, not depicted. The chuck table 36 is rotatable about its own axis by a stepping motor, not depicted, disposed in the hollow cylindrical member 34. A pair of clamps 362 are attached to the chuck table 36 for securing an annular frame, not depicted, on which the workpiece is supported by a protective tape, not depicted, to the suction chuck 361.

The first slide block 32 has a pair of guided grooves 321 defined in a lower surface thereof and slidably fitted over the guide rails 31, and supports on an upper surface thereof a pair of guide rails 322 extending parallel to each other along the Y-axis directions. According to the present embodiment, the holding mechanism 3 includes a processing feed unit 37 for moving the first slide block 32 in the X-axis directions along the guide rails 31. The processing feed unit 37 includes an externally threaded rod 371 disposed between and extending parallel to the guide rails 31 and a rotary actuator 372 such as a stepping motor, a servomotor, or the like for rotating the externally threaded rod 371 about its own axis. The externally threaded rod 371 has an end rotatably supported on a bearing block 373 fixed to the stationary base 2 and the other end coupled to the output shaft of the rotary actuator 372. The externally threaded rod 371 is threaded in an internally threaded through hole, not depicted, defined in an internally threaded block, not depicted, projecting on a lower surface of a central region of the first slide block 32. When the rotary actuator 372 is energized to rotate the externally threaded rod 371 in one direction or the other, the first slide block 32 is moved in one or the other of the X-axis directions along the guide rails 31.

According to the present embodiment, the laser processing apparatus 1 includes a processing feed distance detecting unit 374 for detecting the distance that the chuck table 36 is processing-fed. The processing feed distance detecting unit 374 includes a linear scale 374a extending on the stationary base 2 along one of the guide rails 31 and a reading head 374b disposed on the first slide block 32 and movable with the first slide block 32 along the linear scale 374a. According to the present embodiment, the reading head 374b sends a pulse to a control unit, to be described later, each time it moves 1 µm along the linear scale 374a. The control unit counts pulses sent from the reading head 374b to detect the distance that the chuck table 36 is processing-fed along one of the X-axis directions. Alternatively, if the rotary actuator 372 includes a stepping motor, then the control unit may detect the distance that the chuck table 36 is processing-fed by counting drive pulses output to the stepping motor. Further alternatively, if the rotary actuator 372 includes a servomotor, then the control unit may detect the distance that the chuck table 36 is processing-fed by counting pulses sent from a rotary encoder, not depicted, that detects the rotational speed of the servomotor.

The second slide block 33 has a pair of guided grooves 331 defined in a lower surface thereof and slidably fitted respectively over the guide rails 322 on the upper surface of the first slide block 32, so that the second slide block 33 is movable in the Y-axis directions. According to the present embodiment, the holding mechanism 3 includes a first indexing feed unit 38 for moving the second slide block 33 in the Y-axis directions along the guide rails 322 on the first slide block 32. The first indexing feed unit 38 includes an externally threaded rod 381 disposed between and extending parallel to the guide rails 322 and a rotary actuator 382 such as a stepping motor, a servomotor, or the like for rotating the externally threaded rod 381 about its own axis. The externally threaded rod 381 has an end rotatably supported on a bearing block 383 fixed to the upper surface of the first slide block 32 and the other end coupled to the output shaft of the rotary actuator 382. The externally threaded rod 381 is threaded in an internally threaded through hole, not depicted, defined in an internally threaded block, not depicted, projecting on a lower surface of a central region of the second slide block 33. When the rotary actuator 382 is energized to rotate the externally threaded rod 381 in one direction or the other, the second slide block 33 is moved in one or the other of the Y-axis directions along the guide rails 322.

According to the present embodiment, the laser processing apparatus 1 includes an indexing feed distance detecting unit 384 for detecting the distance that the second slide block 33, i.e., the chuck table 36, is indexing-fed. The indexing feed distance detecting unit 384 includes a linear scale 384a extending on the second slide block 33 along one of the guide rails 322 and a reading head 384b disposed on the second slide block 33 and movable with the second slide block 33 along the linear scale 384a. According to the present embodiment, the reading head 384b sends a pulse to the control unit each time it moves 1 µm along the linear scale 384a. The control unit counts pulses sent from the reading head 384b to detect the distance that the chuck table 36 is indexing-fed along one of the Y-axis directions. Alternatively, if the rotary actuator 382 includes a stepping motor, then the control unit may detect the distance that the chuck table 36 is indexing-fed by counting drive pulses output to the stepping motor. Further alternatively, if the rotary actuator 382 includes a servomotor, then the control unit may detect the distance that the chuck table 36 is indexing-fed by counting pulses sent from a rotary encoder, not depicted, that detects the rotational speed of the servomotor.

The laser beam applying unit support mechanism 4 includes a pair of guide rails 41 disposed on the stationary base 2 and extending parallel to each other along the Y-axis directions, and a movable support base 42 slidably disposed on the guide rails 41 for movement therealong in the Y-axis directions. The movable support base 42 includes a movable support table 421 slidably disposed on the guide rails 41 and an upstanding mount 422 mounted on the movable support table 421. The upstanding mount 422 supports on a vertical side surface thereof a pair of guide rails 423 extending parallel to each other in the Z-axis directions. The laser beam applying unit support mechanism 4 also includes a second indexing feed unit 43 for moving the movable support base 42 in the Y-axis directions along the guide rails 41. The second indexing feed unit 43 includes an externally threaded rod 431 disposed between and extending parallel to the guide rails 41 and a rotary actuator 432 such as a stepping motor or the like for rotating the externally threaded rod 431 about its own axis. The externally threaded rod 431 has an end rotatably supported on a bearing block, not depicted, fixed to the stationary base 2 and the other end coupled to the output shaft of the rotary actuator 432. The externally threaded rod 431 is threaded in an internally threaded through hole, not depicted, defined in an internally threaded block, not depicted, projecting on a lower surface of a central region of the movable support table 421. When the rotary actuator 432 is energized to rotate the externally threaded rod 431 in one direction or the other, the movable support base 42 is moved in one or the other of the Y-axis directions along the guide rails 41.

Figure 2:
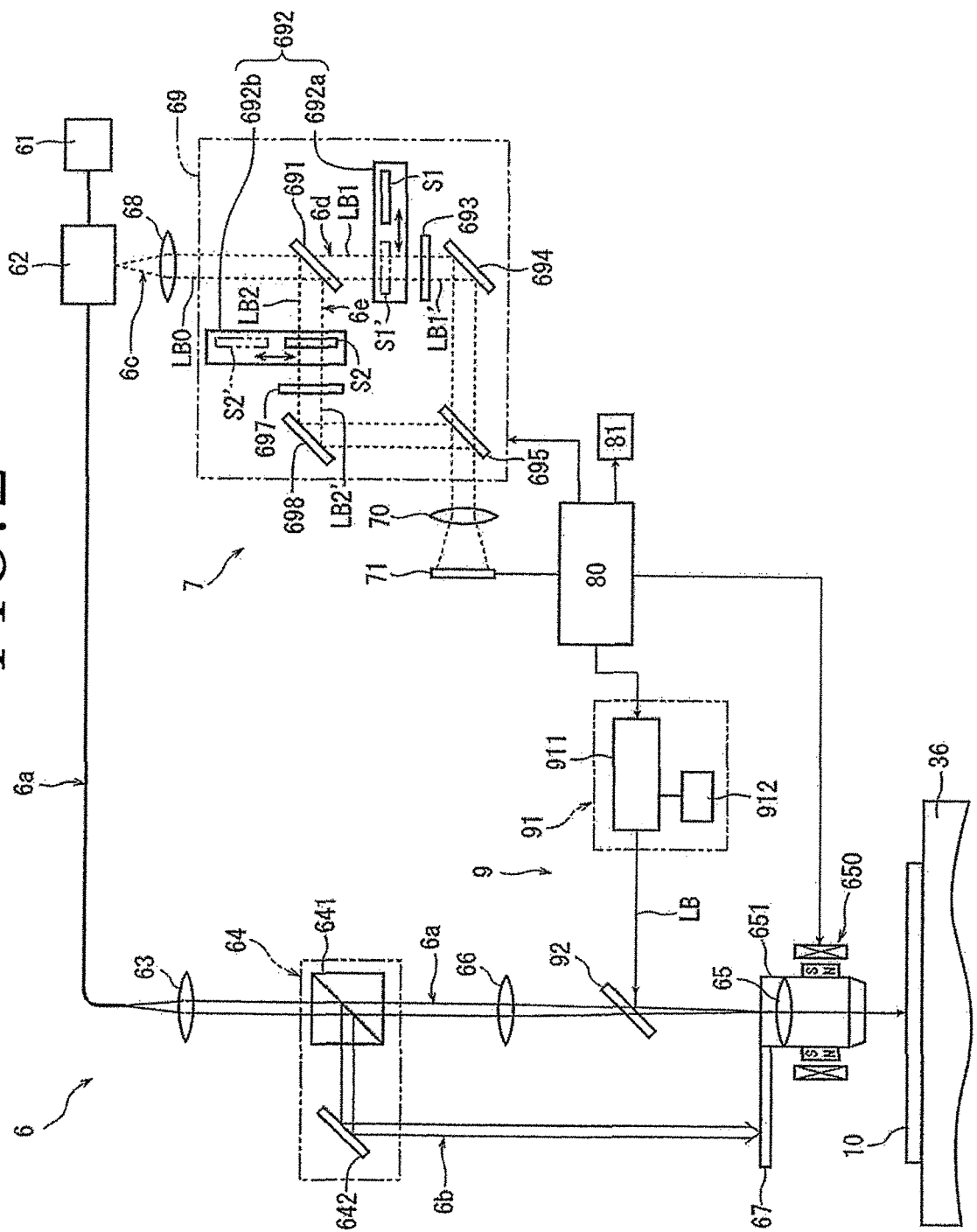
FIG. 2 is a block diagram of a height detecting apparatus and a laser beam applying unit incorporated in the laser processing apparatus depicted in FIG. 1.

According to the present embodiment, the height detecting and laser beam applying unit 5 includes a unit holder 51 and a hollow cylindrical unit housing 52 mounted on and extending from the unit holder 51. The unit holder 51 is slidably disposed on the guide rails 423 on the upstanding mount 422 for movement in the Z-axis directions. The unit housing 52 mounted on the unit holder 51 houses therein a height detecting unit for detecting the height of a workpiece held on the chuck table 36 and a laser beam applying unit for applying a laser beam to the workpiece held on the chuck table 36. The height detecting unit and the laser beam applying unit will be described below with reference to FIG. 2.

The height detecting apparatus according to the present embodiment includes a height detecting unit 6 for detecting the height of a workpiece and the chuck table 36 that holds a semiconductor wafer 10 as the workpiece thereon. The height detecting unit 6 includes a spectral interference height detecting unit that detects the height of the upper surface of the semiconductor wafer 10 by applying light in a particular wavelength band to the upper surface of the semiconductor wafer 10, capturing an interference between reflected light and reference light with an image sensor, and performing Fourier transform, etc. on the captured interference. The height detecting unit 6 will be described in detail below with reference to FIG. 2.

The height detecting unit 6 includes a light source 61 for emitting light in a predetermined wide wavelength band into a first optical path 6a, a condensing lens 65 disposed in the first optical path 6a as a light condenser for condensing and applying the light from the light source 61 to the semiconductor wafer 10, a first optical splitter 62 for guiding the light from the light source 61 to the first optical path 6a and guiding light traveling back along the first optical path 6a to a third optical path 6c, to be described below, a second optical splitter 64 including a beam splitter 641 for splitting light to a second optical path 6b from the light traveling straight through the first optical splitter 62 along the first optical path 6a to the semiconductor wafer 10, a mirror 67 for reflecting the light guided to the second optical path 6b back to the first optical path 6a, and a calculating unit 7 disposed in the third optical path 6c for calculating the height of the upper surface of the semiconductor wafer 10 based on interference light.

The light source 61 may include a light emitting diode (LED), a superluminescent diode (SLD), a laser diode (LD), a halogen light source, an amplified spontaneous emission (ASE) light source, or a supercontinuum that emits light in a wide wavelength band, e.g., in a wavelength band from 620 to 870 nm. The first optical splitter 62 may include a polarization-holding fiber coupler, a polarization-holding fiber circulator, a single-mode fiber coupler, a single-mode fiber coupler circulator, or the like. According to the present embodiment, the second optical splitter 64 includes the beam splitter 641 and a direction-changing mirror 642. The optical path from the light source 61 to the first optical splitter 62 and the optical path from the first optical splitter 62 to a collimation lens 63 in the first optical path from the first optical splitter 62 to the semiconductor wafer 10 on the chuck table 36 include an optical fiber.

The condensing lens 65 for guiding the light guided to the first optical path 6a to the semiconductor wafer 10 held on the chuck table 36, and a condensing lens 66 that is disposed between the condensing lens 65 and the second optical splitter 64 are disposed in the first optical path 6a between the beam splitter 641 and the semiconductor wafer 10. The condensing lens 66 serves to converge parallel-ray light guided from the second optical splitter 64 into a focused spot positioned in the condensing lens 65. The condensing lens 66 disposed between the condensing lens 65 and the second optical splitter 64 is able to converge the light which has been reflected by the semiconductor wafer 10 on the chuck table 36 and travelling back through the condensing lens 65, the condensing lens 66, the second optical splitter 64, and the collimation lens 63, into the optical fiber of the first optical path 6a. The condensing lens 65 is mounted in a lens case 651 that is movable vertically in FIG. 2, i.e., in the focused-spot position adjusting directions, i.e., Z-axis directions, perpendicular to the holding surface of the chuck table 36, by a first focused-spot position adjusting unit 650 such as a voice coil motor, a linear motor, or the like. The first focused-spot position adjusting unit 650 is controlled by a control unit 80 to be described later.

The mirror 67 for reflecting parallel-ray light guided to the second optical path 6b to form a basic optical path length is disposed in the second optical path 6b. According to the present embodiment, the mirror 67 is mounted on the lens case 651 of the condensing lens 65.

The calculating unit 7 is disposed in the third optical path 6c into which the light travelling back through the first optical path 6a is split by the first optical splitter 62. The calculating unit 7 includes a wavelength band splitter 69 for splitting the light in the wavelength band emitted from the light source 61 into light in at least two wavelength bands and selecting the light in either one of the wavelength bands split by a selector assembly 692 of the wavelength band splitter 69. An image sensor 71 captures interference light in the wavelength band selected by the wavelength band splitter 69, and the control unit 80 calculates the height of the semiconductor wafer 10 based on the captured interference light.

Specifically, the wavelength band splitter 69 includes a dichroic mirror 691 for splitting light LB0, which is parallel-ray light formed by a collimation lens 68, into light LB1 in a first wavelength band ranging from 600 to 800 nm and light LB2 in a second wavelength band ranging from 800 to 900 nm, transmitting the light LB1 to a first splitter optical path 6d, and reflecting the light LB2 to a second splitter optical path 6e, and the selector assembly 692, which includes a first selector 692a and a second selector 692b, for selecting one of the light LB1 and the light LB2 by selectively passing and interrupting the light LB1 and the light LB2. The first selector 692a and the second selector 692b have light blocking plates S1 and S2, respectively, actuatable by respective actuating means, not depicted, for selectively blocking and clearing the first splitter optical path 6d and the second splitter optical path 6e. The light blocking plates S1 and S2 are controlled by instruction signals from the control unit 80 to bring the wavelength band splitter 69 selectively into a first selection state in which the wavelength band splitter 69 selects and outputs the light LB1 in the first wavelength band and a second selection state in which the wavelength band splitter 69 selects and outputs the light LB2 in the second wavelength band.

According to the present embodiment, the wavelength band splitter 69 further includes a first bandpass filter 693 for transmitting only light in a wavelength band ranging from 820 to 870 nm to remove noise light from the light LB1 in the first wavelength band selected by the selector assembly 692, a second bandpass filter 697 for transmitting only light in a wavelength band ranging from 620 to 670 nm to remove noise light from the light LB2 in the second wavelength band selected by the selector assembly 692, a first diffraction grating 694 for dispersing light LB1' transmitted through the first bandpass filter 693 out of the light LB1 in the first wavelength band, a second diffraction grating 698 for dispersing light LB2' transmitted through the second bandpass filter 697 out of the light LB2 in the second wavelength band, and a dichroic mirror 695 for transmitting the light LB1' dispersed by the first diffraction grating 694, reflecting the light LB2' dispersed by the second diffraction grating 698, and guiding the transmitted light LB1' and the light reflected LB2' through a condensing lens 70 to the image sensor 71.

Figure 3A:
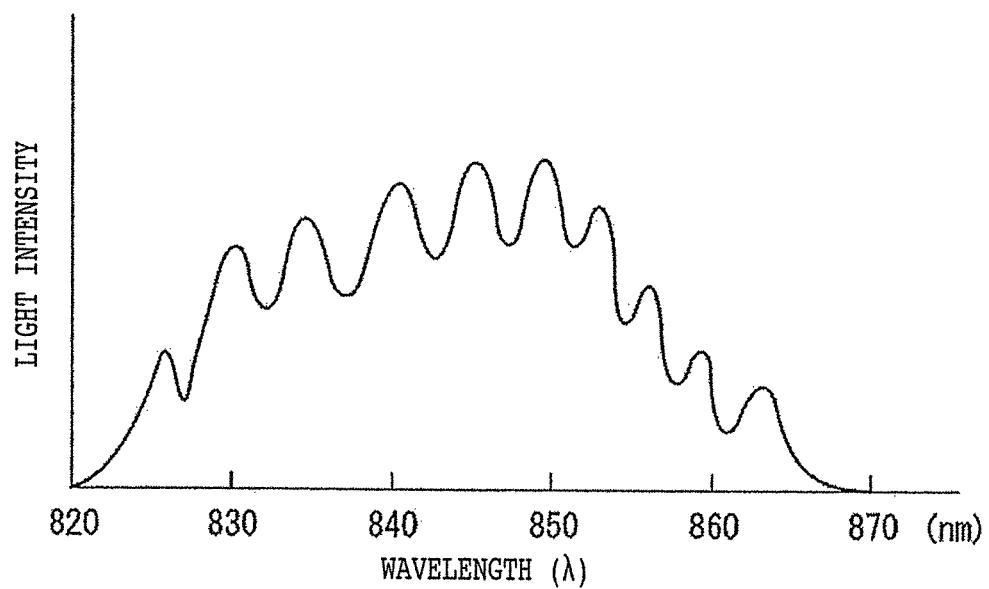
FIGS. 3A and 3B are conceptual diagrams depicting spectral interference waveforms produced by the height detecting apparatus depicted in FIG. 2.
Figure 3B:
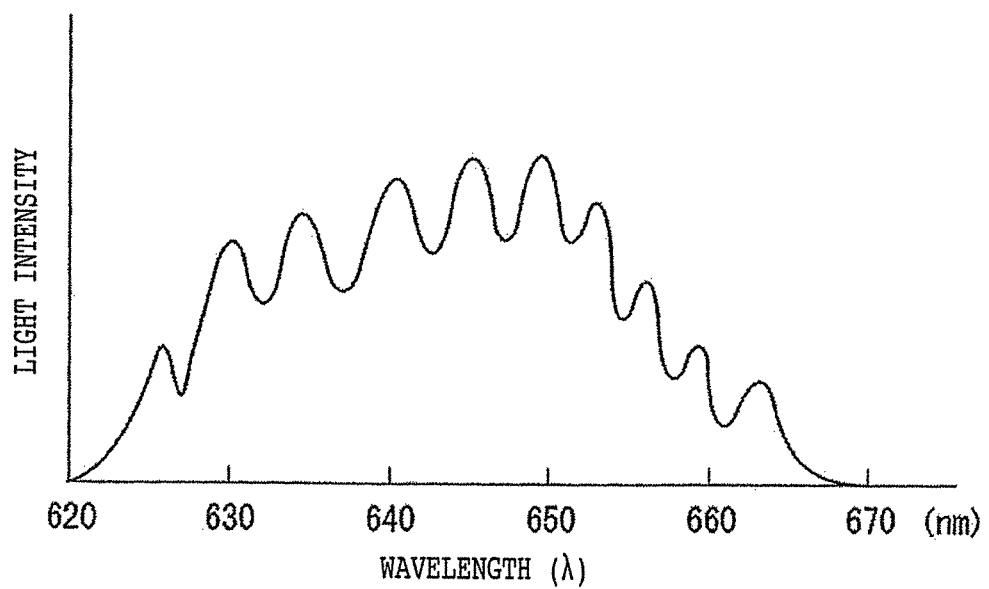

The light emitted from the wavelength band splitter 69 via the dichroic mirror 695 travels through the condensing lens 70 to the image sensor 71, which detects the intensity at each wavelength of the diffracted light that has traveled through the condensing lens 70. A detected signal from the image sensor 71 is sent to the control unit 80. Based on the detected signal from the image sensor 71, the control unit 80 determines spectral interference waveforms as depicted in FIGS. 3A and 3B. To the control unit 80, there is connected a display unit 81 for displaying various pieces of information including the spectral interference waveforms. In FIGS. 3A and 3B, the horizontal axis represents wavelengths of interference light and the vertical axis intensities of light.

The control unit 80 determines spectral interference waveforms from the detected signal from the image sensor 71, performs a waveform analysis according to the Fourier transform theory or the wavelet transform theory based on the spectral interference waveforms and theoretical waveform functions to determine the optical path length difference between the optical path length of the first optical path 6a from the light source 61 to the semiconductor wafer 10 held on the chuck table 36 and the optical path length of the second optical path 6b from the light source 61 to the mirror 67, and determines the distance from the surface of the chuck table 36 to the upper surface of the semiconductor wafer 10 held on the chuck table 36 based on the optical path length difference. Details of such a calculating process are known in the arm as disclosed in Japanese Patent Laid-open No. 2011-122894 and will not be described below.

Referring back to FIG. 2, a laser beam applying unit 9 that is housed in the unit housing 52 of the height detecting and laser beam applying unit 5 includes a pulsed laser beam oscillating unit 91 for oscillating a pulsed laser beam that processes the semiconductor wafer 10 and a dichroic mirror 92 for directing the pulsed laser beam oscillated by the pulsed laser beam oscillating unit 91 toward the condensing lens 65. The pulsed laser beam oscillating unit 91 includes a pulsed laser oscillator 911 such as a YAG laser oscillator or a YVO4 laser oscillator and repetitive frequency setting means 912 connected to the pulsed laser oscillator 911. The pulsed laser beam oscillating unit 91 oscillates a pulsed laser beam LB having a wavelength of 1064 nm, for example. The dichroic mirror 92, which is disposed between the condensing lens 66 and the condensing lens 65, transmits the light from the condensing lens 66 therethrough, but directs the pulsed laser beam LB oscillated by the pulsed laser beam oscillating unit 91 toward the condensing lens 65. In other words, the dichroic mirror 92 transmits light in a wavelength band from 600 to 900 nm therethrough, but reflects light in other wavelengths including a wavelength of 1064 nm. Therefore, the pulsed laser beam LB oscillated by the pulsed laser beam oscillating unit 91 is changed in direction through 90 degrees by the dichroic mirror 92, applied to the condensing lens 65, focused by the condensing lens 65, and applied to the semiconductor wafer 10 held on the chuck table 36.

Referring back to FIG. 1, the laser processing apparatus 1 according to the present embodiment includes a second focused-spot position adjusting unit 53 for moving the unit holder 51 in the focused-spot position adjusting directions, i.e., the Z-axis directions, perpendicular to the holding surface of the chuck table 36 along the guide rails 423 on the upstanding mount 422 of the movable support base 42. The second focused-spot position adjusting unit 53 includes an externally threaded rod, not depicted, disposed between and extending parallel to the guide rails 423 and a rotary actuator 532 such as a stepping motor the like for rotating the externally threaded rod about its own axis. When the rotary actuator 532 is energized to rotate the externally threaded rod in one direction or the other, the height detecting and laser beam applying unit 5 is moved in one or the other of the Z-axis directions along the guide rails 423. Specifically, according to the present embodiment, when the rotary actuator 532 is energized to rotate in a normal direction, the height detecting and laser beam applying unit 5 is moved upwardly in FIG. 1, and when the rotary actuator 532 is energized to rotate in a reverse direction, the height detecting and laser beam applying unit 5 is moved downwardly in FIG. 1.

An image capturing unit 95 is mounted on a front end of the unit housing 52 of the height detecting and laser beam applying unit 5. The image capturing unit 95 includes an ordinary image capturing element (CCD) for capturing an image with visible light, an infrared radiation applying unit for applying an infrared radiation to the semiconductor wafer 10, an optical system for receiving the infrared radiation from the infrared radiation applying unit, and an image capturing element (infrared CCD) for outputting an electric signal commensurate with the infrared radiation received by the optical system. The image capturing unit sends an image signal representing the captured image to the control unit 80.

Figure 4:
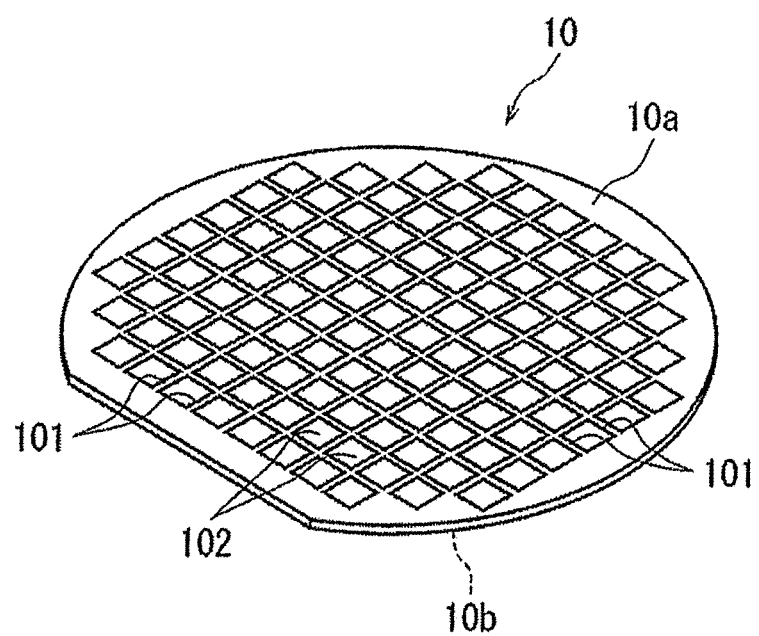
FIG. 4 is a perspective view of a semiconductor wafer as a workpiece processed by the laser processing apparatus depicted in FIG. 1.

The laser processing apparatus 1 according to the present invention is basically arranged as described above. Operation of the laser processing apparatus 1 will be described below. FIG. 4 depicts in perspective the semiconductor wafer 10 to be processed by the laser processing apparatus 1. As depicted in FIG. 4, the semiconductor wafer 10 has a grid of streets 101 on a face side 10a thereof which demarcate the face side 10a into a plurality of areas where devices 102 such as ICs, LSI circuits, or the like are formed.

A laser processing sequence for applying a laser beam to the semiconductor wafer 10 along the streets 101 to form modified layers in the semiconductor wafer 10 along the streets 101, using the laser processing apparatus 1 will be described below. When modified layers are to be formed in the semiconductor wafer 10, if the thickness of the semiconductor wafer 10 suffers irregularities, then the modified layers cannot be formed uniformly at a predetermined depth in the semiconductor wafer 10 due to problems involving the refractive index thereof. Therefore, before the semiconductor wafer 10 is processed by the laser beam, the height detecting unit 6 described above detects the height of the upper surface of the semiconductor wafer 10 held on the chuck table 36.

First, the semiconductor wafer 10 with a reverse side 10b facing upwardly is placed on the chuck table 36 of the laser processing apparatus 1 and held under suction on the chuck table 36. The chuck table 36 on which the semiconductor wafer 10 is held under suction is positioned directly below the image capturing unit 95 by the processing feed unit 37.

When the chuck table 36 is positioned directly below the image capturing unit 95, the image capturing unit 95 and the control unit 80 perform an alignment process for detecting a region of the semiconductor wafer 10 which is to be processed by a laser beam. Specifically, the image capturing unit 95 and the control unit 80 perform an image processing sequence such as pattern matching or the like for positioning those streets 101 on the semiconductor wafer 10 that extend in a first direction with respect to the condensing lens 65 of the height detecting unit 6 of the height detecting and laser beam applying unit 5 to detect the streets 101, and then perform an alignment process on the detected streets 101. The image capturing unit 95 and the control unit 80 similarly perform an alignment process on detected positions on the detected streets 101 on the semiconductor wafer 10 that extend in a second direction perpendicular to the first direction. Although the face side 10a of the semiconductor wafer 10 on which the streets 101 are formed faces downwardly in contact with the chuck table 36, the image capturing unit 95 can capture an image of the streets 101 through the reverse side 10b because it has the image capturing unit including the infrared radiation applying unit for applying an infrared radiation, the optical system for receiving the infrared radiation from the infrared radiation applying unit, and the image capturing element (infrared CCD) for outputting an electric signal commensurate with the infrared radiation received by the optical system, as described above.

Figure 5A:
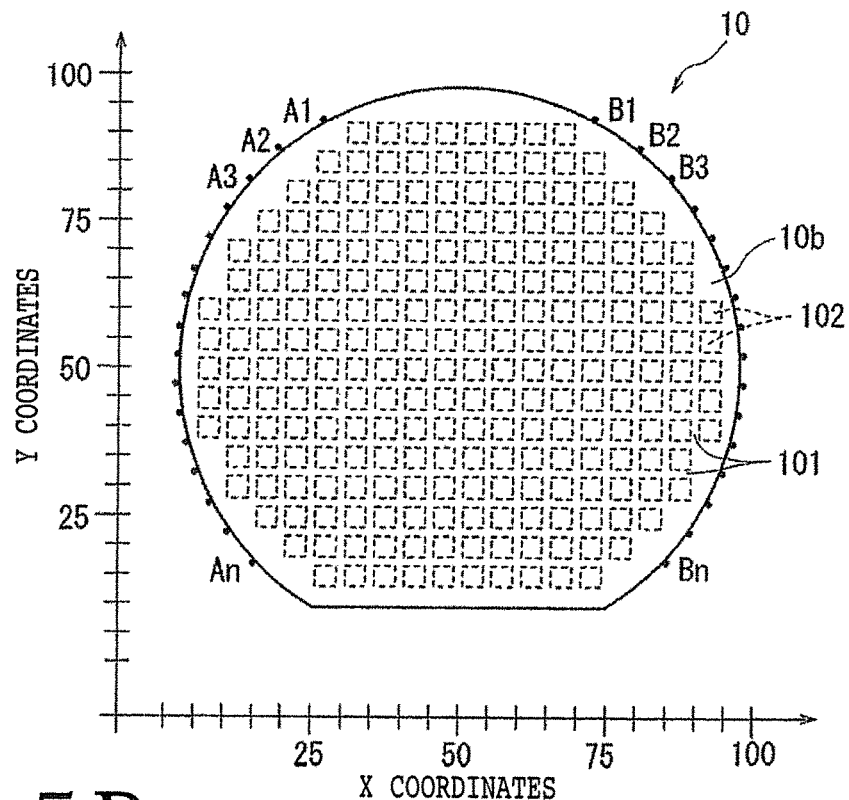
FIGS. 5A and 5B are plan views depicting the relationship between regions of the semiconductor wafer depicted in FIG. 4 and coordinate positions when the semiconductor wafer is held in a predetermined position on a chuck table.
Figure 5B:
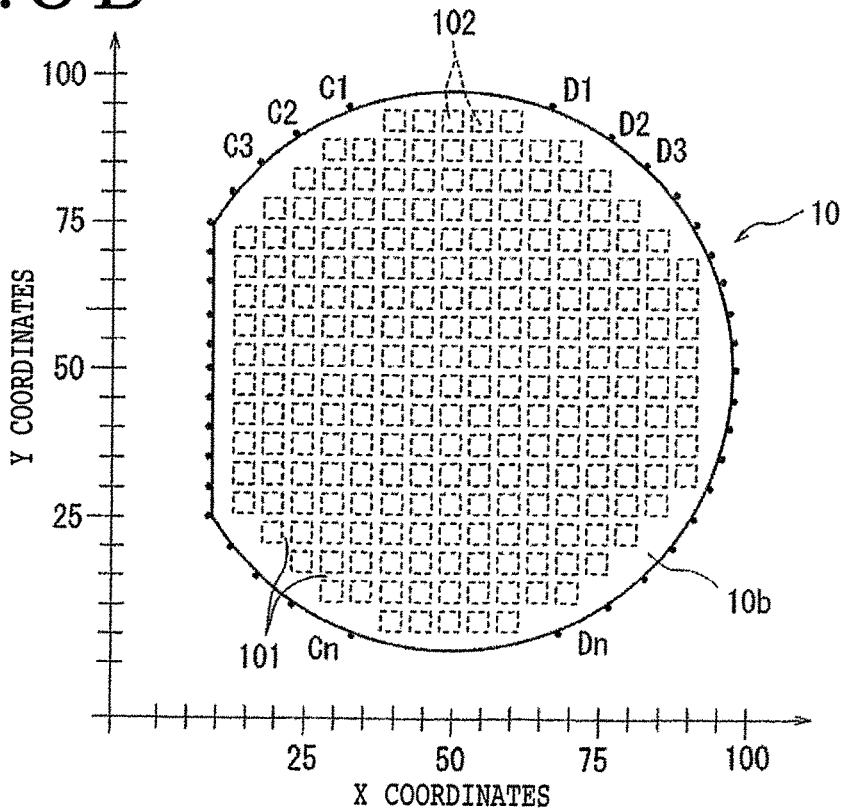

As a result of the above alignment processes, the semiconductor wafer 10 on the chuck table 36 is positioned in coordinate positions depicted in FIG. 5A. FIG. 5B depicts the semiconductor wafer 10 on the chuck table 36 that is turned 90 degrees from the state depicted in FIG. 5A.

FIG. 5A depicts feed-start-position coordinate values (A1, A2, A3, . . . , An) and feed-end-position coordinate values (B1, B2, B3, . . . , Bn) for the streets 101 extending in the first direction on the semiconductor wafer 10 that is positioned in the coordinate positions depicted in FIG. 5A. FIG. 5B depicts feed-start-position coordinate values (C1, C2, C3, . . . , Cn) and feed-end-position coordinate values (D1, D2, D3, . . . , Dn) for the streets 101 extending in the second direction on the semiconductor wafer 10 that is positioned in the coordinate positions depicted in FIG. 5B. Data of those feed-start-position coordinate values (A1, A2, A3, . . . , An), feed-end-position coordinate values (B1, B2, B3, . . . , Bn), feed-start-position coordinate values (C1, C2, C3, . . . , Cn), and feed-end-position coordinate values (D1, D2, D3, . . . , Dn) that are measured are stored in a memory of the control unit 80.

Figure 6:
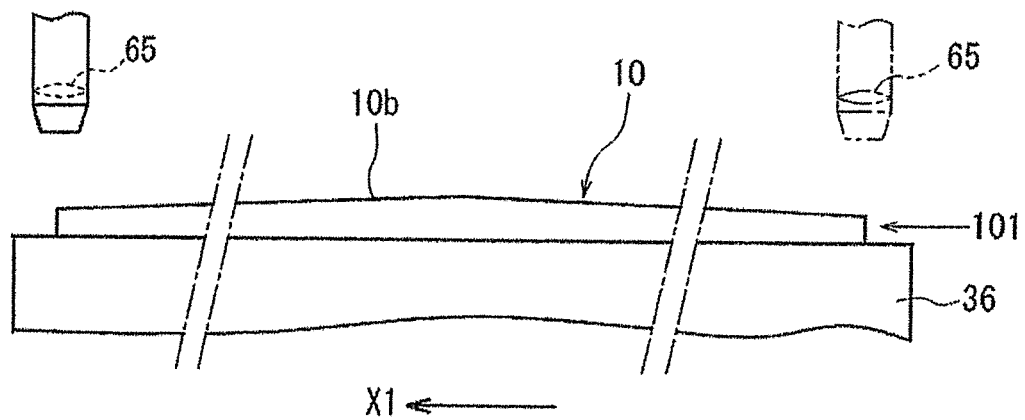
FIG. 6 is a side elevational view illustrating a height detecting step carried out by the height detecting apparatus incorporated in the laser processing apparatus depicted in FIG. 1.

After the streets 101 on the semiconductor wafer 10 held on the chuck table 36 have been detected and aligned as described above, the chuck table 36 is moved to position the uppermost street 101 in FIG. 5A, which extends between the feed-start-position coordinate value (A1) and the feed-end-position coordinate value (B1), directly below the condensing lens 65 of the height detecting unit 6. Then, as depicted in FIG. 6, the chuck table 36 is moved to position the feed-start-position coordinate value (A1), which represents the left end of the uppermost street 101 in FIG. 5A, directly below the condensing lens 65.

After the feed-start-position coordinate value (A1) has been positioned directly below the condensing lens 65, the height detecting unit 6 is operated to carry out a height detecting step. The height detecting step will be described below with reference to FIG. 2. In preparation for the height detecting step, the first selector 692a and the second selector 692b of the selector assembly 692 are set to the first selection state according to instruction signals from the control unit 80.

Specifically, the first selector 692a disposed in the first splitter optical path 6d has its light blocking plate S1 actuated by the actuating means, not depicted, to move to the position in which the light blocking plate S1 clears the first splitter optical path 6d, i.e., to the solid-line position, according to an instruction signal from the control unit 80. In this state, the light LB1 in the first wavelength band split by the dichroic mirror 691 passes through the first selector 692a. The second selector 692b disposed in the second splitter optical path 6e has its light blocking plate S2 actuated by the actuating means, not depicted, to move to the position in which the light blocking plate S2 blocks the second splitter optical path 6e, i.e., to the solid-line position, according to an instruction signal from the control unit 80. The light LB2 in the second wavelength band split by the dichroic mirror 691 is now interrupted by the second selector 692b and hence does not pass through the second selector 692b. In the first selection state, only the light LB1 in the first wavelength band split by the dichroic mirror 691 passes through the selector assembly 692, so that light LB1' in a wavelength band ranging from 820 to 870, from which noise has been removed by the bandpass filter 693, is diffracted by the first diffraction grating 694 and passes through the dichroic mirror 695 and the condensing lens 70 to the image sensor 71.

With the selector assembly 692 in the first selection state, the height detecting unit 6 is operated, and the chuck table 36 is moved in the direction indicated by the arrow X1 in FIG. 6 until the feed-end-position coordinate value (B1), which represents the right end of the uppermost street 101 in FIG. 5A, is positioned directly below the condensing lens 65 (height detecting step). As a result, the height of the upper surface, i.e., the reverse side 10b, of the semiconductor wafer 10 along the uppermost street 101 in FIG. 5A is detected by the height detecting unit 6.

After the height of the upper surface of the semiconductor wafer 10 along the uppermost street 101 from the feed-start-position coordinate value (A1) to the feed-end-position coordinate value (B1) has been detected, the operator confirms the spectral interference waveform detected by the image sensor 71 on the display unit 81 connected to the control unit 80. As described above, if a film such as an oxide film, an insulating film, or the like is deposited on the upper surface of the semiconductor wafer 10, the upper surface of the semiconductor wafer 10 does not sufficiently reflect light applied thereto, and the refractive interference height detecting apparatus fails to produce a refractive interference waveform based on light in a particular wavelength band, e.g., the light LB1 in the first wavelength band in the present embodiment. Consequently, a refractive interference waveform suitable for detecting the height of the upper surface of the semiconductor wafer 10 may not be produced, and the height of the upper surface of the semiconductor wafer 10 may not be detected. In the event that no appropriate refractive interference waveform is produced while the wavelength band splitter 69 is in the first selection state, i.e., the light LB1 in the first wavelength band is selected in the wavelength band splitter 69, the operator determines that the upper surface of the semiconductor wafer 10 is in a state not suitable for reflecting the light LB1 in the first wavelength band. The control unit 80 outputs instruction signals to bring the wavelength band splitter 69 into the second selection state, i.e., the light LB2 in the second wavelength band is selected in the wavelength band splitter 69.

Specifically, the first selector 692a disposed in the first splitter optical path 6d has its light blocking plate S1 actuated by the actuating means, not depicted, to move to the position in which the light blocking plate S1 block the first splitter optical path 6d, i.e., to the two-dot-and-dash-line position S1', according to an instruction signal from the control unit 80. In this state, the light LB1 in the first wavelength band split by the dichroic mirror 691 does not pass through the first selector 692a, but is interrupted by the first selector 692a. The second selector 692b disposed in the second splitter optical path 6e has its light blocking plate S2 actuated by the actuating means, not depicted, to move to the position in which the light blocking plate S2 clears the second splitter optical path 6e, i.e., to the two-dot-and-dash-line position S2', according to an instruction signal from the control unit 80. The light LB2 in the second wavelength band split by the dichroic mirror 691 is not interrupted by the second selector 692b, but passes through the second selector 692b. In the second selection state, only the light LB2 in the second wavelength band split into the second splitter optical path 6e by the dichroic mirror 691 passes through the selector assembly 692, so that light LB2' in a wavelength band ranging from 620 to 670 nm from which noise has been removed by the bandpass filter 697, is diffracted by the second diffraction grating 698 and reflected by the dichroic mirror 695, and passes through the condensing lens 70 to the image sensor 71. The light LB2' in the second wavelength band, from which noise has been removed, is selected as light that can well be reflected by the upper surface of the semiconductor wafer 10 which is deposited with a film such as an oxide film, an insulating film, or the like. With the wavelength band splitter 69 in the second selection state, a good spectral interference waveform as depicted in FIG. 3B can be obtained. After a good spectral interference waveform has been obtained, the heights of the semiconductor wafer 10 at the respective coordinate values are detected.

By selecting either the first selection state or the second selection state for the wavelength band splitter 69, an appropriate spectral interference waveform can be produced by the height detecting apparatus, allowing the calculating unit 7 to accurately detect the height of the upper surface of the semiconductor wafer 10. The height that is detected and a coordinate position where the height is detected are stored in the memory of the control unit 80. Specifically, the height detecting step is carried out along all the streets 101 formed on the semiconductor wafer 10, and, as depicted in FIG. 7, heights Z(1,1) through Z(n,n) of the upper surface of the semiconductor wafer 10 at respective coordinate positions (X1 through Xn, Y1 through Yn) of the streets 101 are stored in the memory of the control unit 80.

After the height detecting step has been carried out along all the streets 101 formed on the semiconductor wafer 10, a laser processing step for forming modified layers in the semiconductor wafer 10 along the streets 101 is carried out.

For carrying out the laser processing step, the chuck table 36 is moved to position the uppermost street 101 in FIG. 5A directly below the condensing lens 65 that also functions as the condensing lens of the laser beam applying unit 9. Then, the chuck table 36 is moved to position the feed-start-position coordinate value (A1), which represents the left end of the uppermost street 101 in FIG. 5A, directly below the condensing lens 65. Thereafter, the focused spot P of the pulsed laser beam emitted from the condensing lens 65 is placed at a predetermined depth from the upper surface of the semiconductor unit 10. The laser beam applying unit 9 is then operated to apply the pulsed laser beam through the condensing lens 65 while the chuck table 36 is processing-fed along the uppermost street 101 at a predetermined processing feed speed (laser processing step). When the pulsed laser beam emitted from the condensing lens 65 has reached the feed-end-position coordinate value (B1) at the right end of the uppermost street 101, the laser beam applying unit 9 stops applying the pulsed laser beam to the semiconductor wafer 10, and the chuck table 36 stops moving. While in the laser processing step, the control unit 80 controls the first focused-spot position adjusting unit 650 based on the heights, stored in the memory, of the upper surface of the semiconductor wafer 10 along the uppermost street 101, to move the height detecting and laser beam applying unit 5 in the Z-axis directions, i.e., the focused-spot position adjusting directions, thereby vertically moving the condensing lens 6 of the laser beam applying unit 9 by distances commensurate with the heights of the upper surface of the semiconductor wafer 10 along the uppermost street 101. As a result, modified layers are formed in the semiconductor wafer 10 parallel to the upper surface thereof at corresponding depths from the upper surface of the semiconductor wafer 10.

The laser processing step is carried out under the following processing conditions:
Laser: YVO4 pulsed laser
Wavelength: 1064 nm
Repetitive frequency: 100 kHz
Pulsed beam output power: 2.5 µJ
Focused spot diameter: 1 µm
Processing feed speed: 100 mm/second After the above laser processing step has been performed along all the streets 101 extending in the first direction on the semiconductor wafer 10, the chuck table 36 is turned 90 degrees about its own axis. Then, the laser processing step is carried out along all the streets 101 extending in the second direction on the semiconductor wafer 10. In this manner, the laser processing step is carried out along all the streets 101 on the semiconductor wafer 101. Thereafter, the chuck table 36 that is holding the semiconductor wafer 10 thereon is returned to the position where it initially held semiconductor wafer 10 under suction, and then releases the semiconductor wafer 10, which will be delivered to a dividing step by delivery means, not depicted.

In the above embodiment, the height detecting apparatus for detecting the height of the workpiece on the chuck table is incorporated in the laser processing apparatus. However, the height detecting apparatus according to the present invention may be incorporated in other processing apparatus such as a cutting apparatus having a cutting blade.

In the above embodiment, furthermore, the light source 61 included in the height detecting unit 6 is configured to emit light in a predetermined wavelength band that includes a wavelength band ranging from 620 to 870 nm. Such a wavelength band is selected such that the light source 61 can emit light in a wavelength band ranging from 820 to 870 nm that can well be reflected from the upper surface of a semiconductor wafer that is free from a film such as an oxide film, an insulating film, or the like and also light in a wavelength band ranging from 620 to 670 nm that can well be reflected from the upper surface of a semiconductor wafer that is deposited with a film such as an oxide film, an insulating film, or the like. However, the light source may be configured freely to emit light in a wavelength band depending on the reflection characteristics of a workpiece to be processed.

In the above embodiment, the wavelength band splitter 69 splits light emitted from the light source 61 into light in two wavelength bands. Depending on the type of a film deposited on the surface of a workpiece, the wavelength band splitter may be configured to split light emitted from the light source 61 into light in three or more wavelength bands, which may be selected one at a time for height detection. According to a configuration proposed for such a modification, a set of a dichroic mirror, a light blocking plate, a diffraction grating, another dichroic mirror, and so on may be disposed in either one or both of the first splitter optical path and the second splitter optical path that are branched from the dichroic mirror 691 of the wavelength band splitter 69 depicted in FIG. 2, for splitting light emitted from the light source 61 into light in three or more wavelength bands.

The wavelength band splitter 69 according to the present embodiment includes the first and second bandpass filters 693 and 697 for removing noise from the light LB1 in the first wavelength band and the light LB2 in the second wavelength band. According to the present invention, the first and second bandpass filters 693 and 697 are not indispensable requirements. If an image sensor of higher resolution is used, then the first and second bandpass filters 693 and 697 may be dispensed with, and the lights LB1 and LB2 with noise unremoved therefrom may be dispersed by the diffraction gratings for spectral interference and analysis. However, a wavelength band that is limited for producing a spectral interference waveform by removing noise allows an image sensor of lower resolution, such as the image sensor 71, to be used for analyzing a spectral interference waveform for accurate height detection.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A spectral interference height detecting apparatus comprising:
   a chuck table for holding a workpiece thereon; and
   a height detecting unit for detecting the height of an upper surface of the workpiece held on said chuck table;
   wherein said height detecting unit includes
      a light source for emitting light in a predetermined wavelength band into a first optical path,
      a condenser disposed in said first optical path for converging light onto the workpiece held on said chuck table,
      a beam splitter disposed between said light source and said condenser for splitting the light in said first optical path into a second optical path,
      a mirror disposed in said second optical path to form a basic optical path length, for reflecting light into said second optical path and returning light through said beam splitter to said first optical path,
      an optical splitter disposed between said beam splitter and said light source, for splitting interference light produced from light reflected by the upper surface of the workpiece held on said chuck table and returned through said condenser to said first optical path and light returned by said mirror, from said first optical path into a third optical path, and
      a calculating unit disposed in said third optical path, for calculating the height of the workpiece based on said interference light;
   said calculating unit includes a wavelength band splitter for splitting the light in the wavelength band emitted from said light source into light in at least two wavelength bands, and a selector for selecting light in either one of the two wavelength bands from said wavelength band splitter; and
   interference light in the wavelength band selected by said selector is captured by an image sensor for calculating the height of the workpiece.

2. The height detecting apparatus according to claim 1, wherein said wavelength band splitter includes
   a dichroic mirror for transmitting therethrough light in a first wavelength band included in the light in the predetermined wavelength band emitted from said light source and reflecting light in a second wavelength band included in the light in the predetermined wavelength band emitted from said light source,
   a first bandpass filter disposed in an optical path for the light in the first wavelength band, for removing noise from the light in the first wavelength band,
   a first diffraction grating for dispersing light from said first bandpass filter in said first wavelength band,
   a second bandpass filter disposed in an optical path for the light in the second wavelength band, for removing noise from the light in the second wavelength band, and
   a second diffraction grating for dispersing light from said second bandpass filter in said second wavelength band; and
   said selector includes a light blocking plate for blocking either one of the optical path for the light in the first wavelength band and the optical path for the light in the second wavelength band.

3. The height detecting apparatus according to claim 1, wherein said calculating unit includes a memory for storing information of the calculated height of the workpiece based on coordinates of the workpiece.

4. A laser processing apparatus comprising:
   a chuck table for holding a workpiece thereon;
   a height detecting unit configured to detect the height of an upper surface of the workpiece held on said chuck table;
   a laser oscillator for oscillating a laser and emitting a laser beam; and
   an optical system for guiding the laser beam emitted from said laser oscillator to a condenser;
   wherein said height detecting unit includes
      a light source for emitting light in a predetermined wavelength band into a first optical path,
      a condenser disposed in said first optical path for converging light onto said workpiece held on said chuck table,
      a beam splitter disposed between said light source and said condenser for splitting the light in said first optical path into a second optical path,
      a mirror disposed in said second optical path to form a basic optical path length, for reflecting light into said second optical path and returning light through said beam splitter to said first optical path,
      an optical splitter disposed between said beam splitter and said light source, for splitting interference light produced from light reflected by the upper surface of the workpiece held on said chuck table and returned through said condenser to said first optical path and light returned by said mirror, from said first optical path into a third optical path, and a calculating unit disposed in said third optical path and configured to calculate the height of the workpiece based on said interference light;

said calculating unit includes a wavelength band splitter for splitting the light in the wavelength band emitted from said light source into light in at least two wavelength bands, a selector for selecting light in either one of the two wavelength bands from said wavelength band splitter, and a memory for storing information of the calculated height of the workpiece based on coordinates of the workpiece; and interference light in the wavelength band selected by said selector is captured by an image sensor for detecting the height of the workpiece;

said laser processing apparatus further comprising:

an actuator disposed on said condenser, for moving said condenser toward and away from the workpiece held on said chuck table based on the information of the calculated height stored in said memory.

* * * * *